US006523159B2

(12) United States Patent
Bernstein et al.

(10) Patent No.: US 6,523,159 B2
(45) Date of Patent: Feb. 18, 2003

(54) METHOD FOR ADDING DECOUPLING CAPACITANCE DURING INTEGRATED CIRCUIT DESIGN

(75) Inventors: Kerry Bernstein, Underhill, VT (US); John M. Cohn, Richmond, VT (US); Jose L. P. Neves, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/761,464

(22) Filed: Jan. 16, 2001

(65) Prior Publication Data

US 2002/0095647 A1 Jul. 18, 2002

(51) Int. Cl.[7] .............................................. G06F 17/50
(52) U.S. Cl. ............................................. 716/10; 716/8
(58) Field of Search .......................... 716/1–14; 438/17

(56) References Cited

U.S. PATENT DOCUMENTS

| | | | |
|---|---|---|---|
| 5,761,080 A | | 6/1998 | DeCamp et al. ................ 716/5 |
| 5,790,839 A | | 8/1998 | Luk et al. .................... 713/501 |
| 5,883,814 A | * | 3/1999 | Luk et al. ....................... 716/2 |
| 5,972,740 A | * | 10/1999 | Nakamori ..................... 716/12 |
| 6,170,079 B1 | * | 1/2001 | Kato et al. ..................... 716/10 |
| 6,323,050 B1 | * | 11/2001 | Dansky et al. ................ 438/17 |

OTHER PUBLICATIONS

IBM Technical Disclosure Bulletin, vol. 38, No. 08, Aug. 1995, 1 page, Place Decoupling Capacitances in a Floor Plan.

* cited by examiner

Primary Examiner—Vuthe Siek
Assistant Examiner—Sun James Lin
(74) Attorney, Agent, or Firm—Schmeiser, Olsen & Watts; Richard M. Kotulak (57) ABSTRACT

A method and a related program storage product for adding decoupling capacitance in an integrated circuit during the floor planning stage of the integrated circuit design. The invention overlay a power grid on the floor plan and then divides the power grid into regions or macros. For each region or macro, a support decoupling capacitance value required to support a voltage of the power grid and a native capacitance value are determined. Based on those values, a required decoupling capacitance value along with its decoupling capacitance area is determined. The design is then alternated based on the decoupling capacitance area.

52 Claims, 5 Drawing Sheets

METHOD FOR ADDING DECOUPLING CAPACITANCE DURING INTEGRATED CIRCUIT DESIGN

BACKGROUND OF THE INVENTION

1. Technical Field

The present invention relates generally to integrated circuits. In particular, the present invention relates to a method for adding decoupling capacitance in an integrated circuit during the floor planning stage of integrated circuit design.

2. Related Art

One current trend in semiconductor design, especially for application specific integrated circuits (ASICs) and other advanced/complex semiconductor integrated circuit devices, such as microprocessors, is to lower the operating power. This trend drives power supply and device threshold (i.e., turn-on) voltages to lower levels. Another trend emphasizing the need for decoupling is that voltage scaling has lagged area/capacitance scaling. As the power grid supply voltage (VDD) and device threshold voltage (Vt) drop, the ratio of noise voltages to Vt and VDD increases, since noise levels do not scale down at the same rate as Vt and VDD. Consequently, sensitivity to noise in these types of semiconductor integrated circuit devices increases.

The increased sensitivity to noise is further exacerbated by local drops in VDD caused by local high current use. This may be caused, for example, by high current circuits or high duty cycle circuits. The effect is that some circuits or groups of circuits do not see the full VDD voltage for a short period of time, further increasing the noise to VDD ratio. Often, such a noise sensitivity problem does not become apparent until very late in the design process, or during actual device fabrication or testing, leading to expensive and time consuming remodeling, simulation, and/or design activity. Currently, the noise sensitivity problem is often overcome by over-designing the integrated circuits to make them more tolerant of noise or power drops. Unfortunately, this solution often results in decreased performance, increased power consumption, increased chip area, and more expensive chips.

One method of compensating for local power grid voltage drops is through the use of decoupling capacitors. The amount of decoupling capacitance required is a local requirement dependent upon such factors as the number of nearby circuits that are switching at one time and the sequence of the switching. The current state of the art accomplishes the task of adding decoupling capacitance to an integrated circuit design using one of two methods. In one method, the amount of decoupling capacitance per input/output (I/O) cell or clock buffer is estimated and then placed near the corresponding circuit. For the rest of the design, rule of thumb methods are used. One is to place the decoupling capacitors close to each latch. Another is to place decoupling capacitors on empty spaces in the chip area after placement. This often results in too much decoupling capacitance being added to the design. In another method, the amount of decoupling capacitance is calculated based on power drops in the grid voltage for the completed circuit as designed. Decoupling capacitors are then placed in those regions of the macros of the chip where there is space for them. One drawback of this method is that available space may not be close enough to where the decoupling capacitance is needed, requiring more decoupling capacitance to eliminate the voltage drop.

Thus, traditional methods of adding or placing decoupling capacitance in an integrated circuit often create other problems that can only be addressed after the design of an integrated circuit is complete. These include, inter alia,: wasted chip space and increased power requirements due to excess decoupling capacitance (and the support circuitry (e.g., switching buffer trees) required to implement the decoupling capacitance); and inadequate compensation for power drops in the grid voltage caused by the post-design placement of decoupling capacitance too far away from the circuit that requires it, increasing wiring requirements.

A need therefore exists for a method for adding decoupling capacitance during the design of an integrated circuit which solves these and other problems associated with currently available capacitance placement techniques.

SUMMARY OF THE INVENTION

The present invention provides a method for adding decoupling capacitance in an integrated circuit during the floor planning stage of integrated circuit design.

Generally, the present invention provides a method for adding decoupling capacitance in an integrated circuit design, comprising:

creating a floor plan for an integrated circuit, the floor plan comprising the relative locations of a plurality of functional units;

overlaying a power grid on the floor plan;

dividing the floor plan and the power grid into a plurality of regions; and, for each region:

determining a support decoupling capacitance value required to support a voltage of the power grid;

determining a native capacitance value;

determining a required decoupling capacitance value based on the support decoupling capacitance value and the native capacitance value;

determining a decoupling capacitor area for the required decoupling capacitance value; and modifying a circuit area in the region based on the decoupling capacitor area.

The present invention additionally provides a method, comprising:

creating a floor plan for an integrated circuit;

dividing the floor plan into a plurality of regions; and, for each region:

determining a support decoupling capacitance value required to support a voltage of a power grid of the floor plan;

determining a native capacitance value;

determining a required decoupling capacitance value based on the support decoupling capacitance value and the native capacitance value;

determining a decoupling capacitor area for the required decoupling capacitance value; and modifying a circuit area in the region based on the decoupling capacitor area.

The present invention further provides a computer program product, comprising:

a computer usable medium having a computer readable program code embodied therein for performing a method for adding decoupling capacitance in an integrated circuit design, the computer readable program code including:

code for causing a computer system to create a floor plan for an integrated circuit;

code for causing a computer system to divide the floor plan into a plurality of regions; and, for each region:

code for causing a computer system to determine a support decoupling capacitance value required to support a voltage of a power grid of the floor plan;

code for causing the computer system to determine a native capacitance value;

code for causing the computer system to determine a required decoupling capacitance value based on the support decoupling capacitance value and the native capacitance value;

code for causing the computer system to determine a decoupling capacitor area for the required decoupling capacitance value; and code for causing the computer system to modify a circuit area in the region based on the decoupling capacitor area.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE INVENTION

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
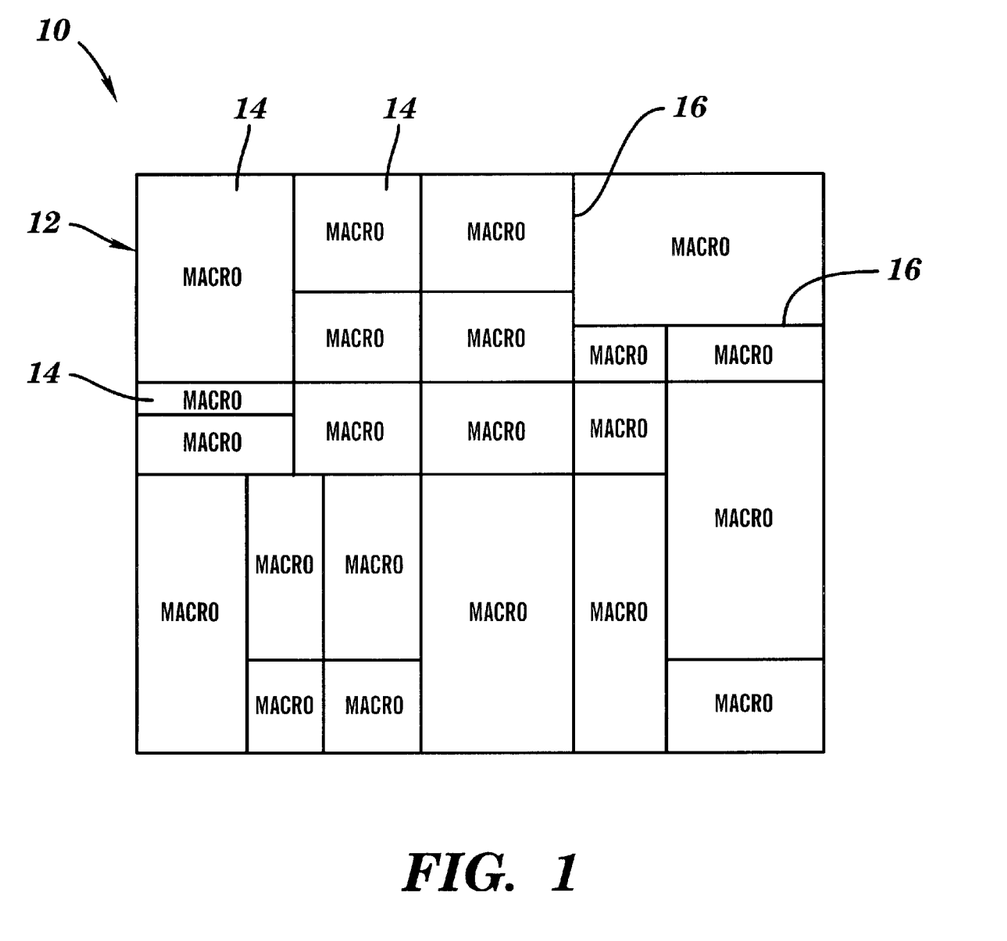
FIG. 1 illustrates a floor plan for an integrated circuit chip.

An exemplary floor plan 12 for an integrated circuit chip 10 is illustrated in FIG. 1. The floor plan 12 comprises the relative locations of a plurality of functional units 14, often referred to as "macros," arranged in a logical relationship to one another to provide a specific function. Many products are available for generating the floor plan 12, including Cplace™ and MCplace™ available from International Business Machines Corporation. In FIG. 1, the heavy lines 16 are used to illustratively define the boundaries of the macros 14 within the floor plan 12.

Each macro 14 provides a predesigned and preverified function, and has well established functional, operational, and electrical characteristics, including, e.g., a built-in decoupling capacitance space requirement (i.e., the amount of area in the macro available for the placement of decoupling capacitors). As illustrated in the flowchart 20 of FIG. 3, a plurality or collection of different macros 14 are typically provided by a macro vendor in a macro library 22. The floor plan 12 for the integrated circuit chip 10 is synthesized 24 in a known manner by mapping the desired circuit functions and requirements 26 for the integrated circuit chip 10, typically defined in a hardware description language (HDL) such as VHDL or Verilog®, to a set of the macros 14 provided in the macro library 22. These circuits may range from the simplest functions, such as inverters, NAND and NOR gates, and flip-flops and latches, to more complex circuits such as adders, counters, mixed signal circuits, phase-lock-loops, memory arrays (e.g., SRAM), digital signal processors, microcontrollers, and even microprocessors.

Figure 2:
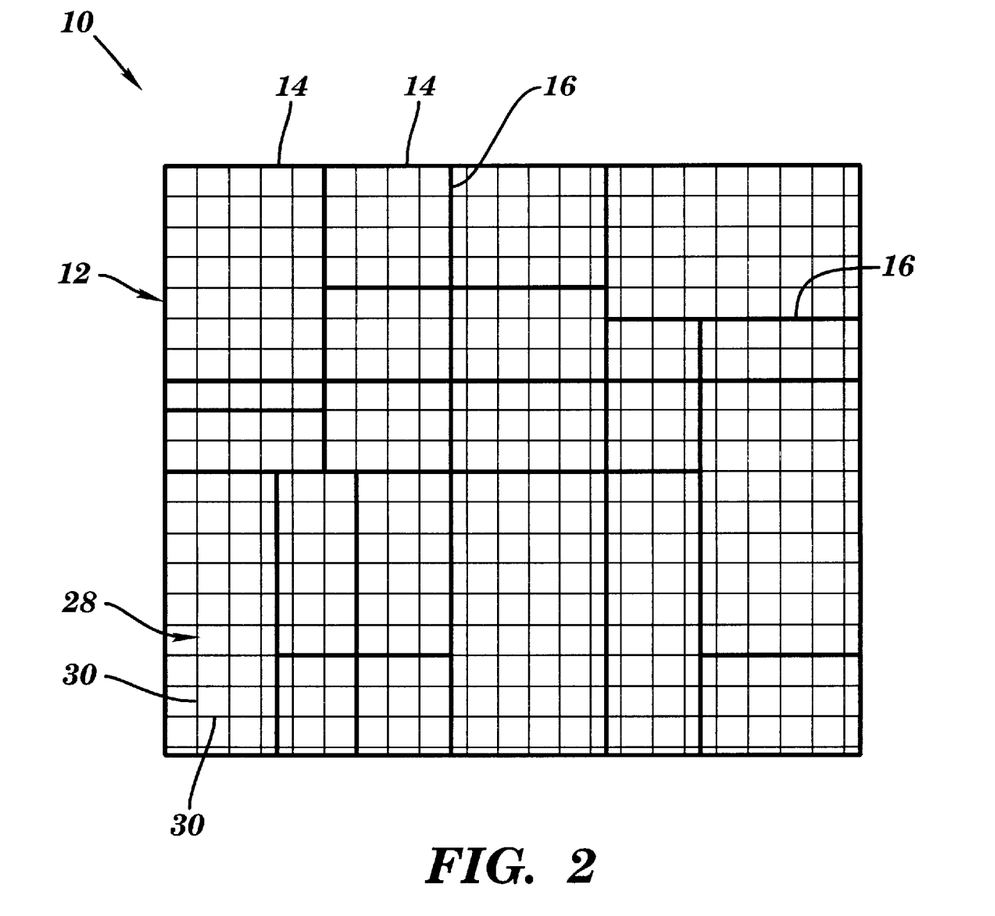
FIG. 2 illustrates the floor plan of FIG. 1 with a power grid overlaid thereon.

A power grid 28 for the floor plan 12 is generated in a known manner and is overlaid or otherwise incorporated into the floor plan 12. The power grid 28 has grid-type structure usually with the same periodicity on all metal layers. In some cases, it is possible to have different power grid pitches within the same floor plan if pre-designed macros such as cores or arrays are used. The resultant structure is shown schematically in FIG. 2, wherein the power grid 28 is represented by lines 30. It should be noted that the power grid 28 illustrated in FIG. 2 is only representative of the fact that a power grid is present, and is not intended to represent the actual structure or layout of a power grid.

Figure 3:
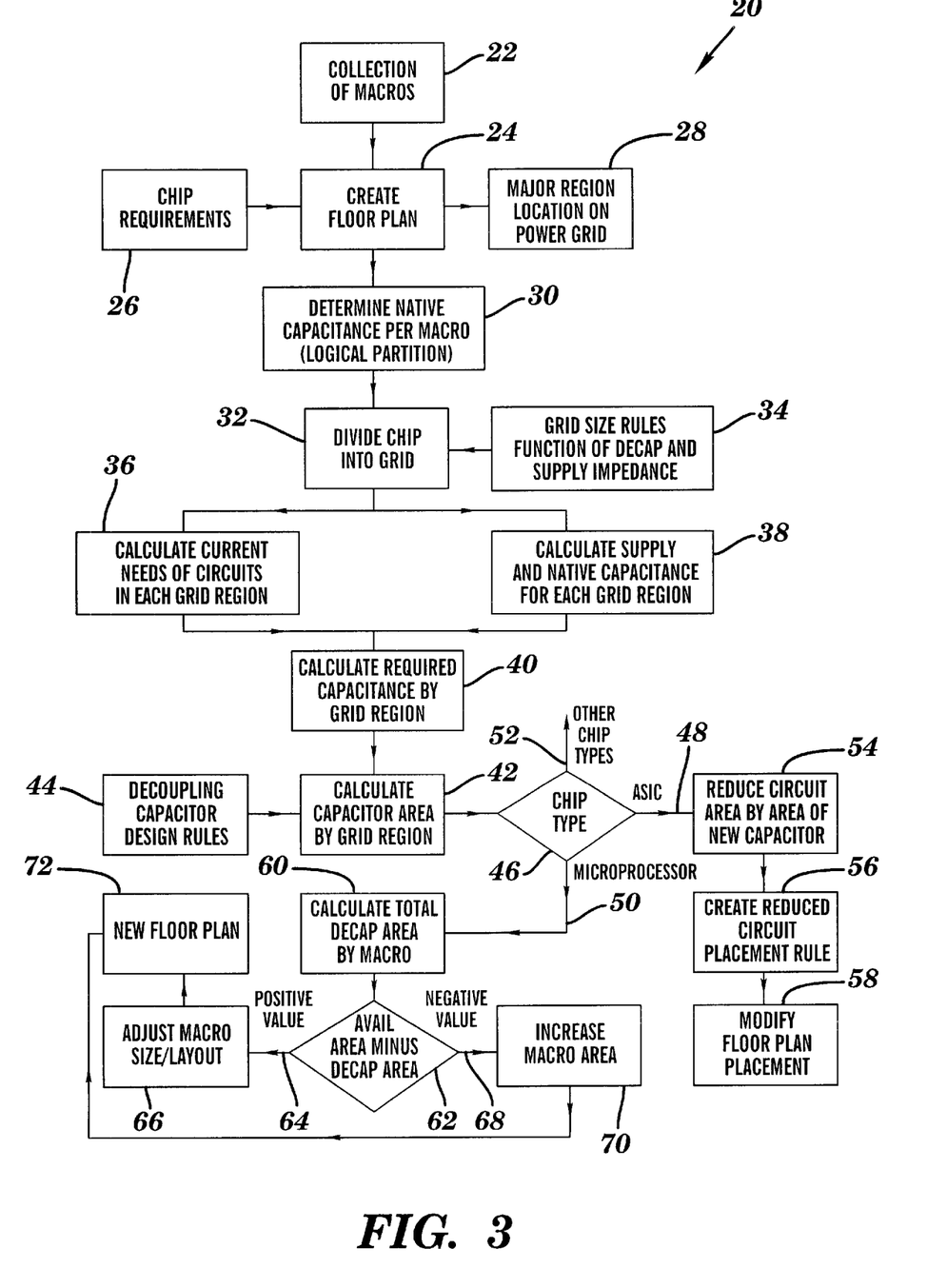
FIG. 3 illustrates a flowchart illustrating the method of the present invention.

In step 30 of FIG. 3, the native capacitance per macro 14, and/or native capacitance distribution per macro 14, is determined. The native capacitance refers to the naturally occurring supply rail (e.g., VDD) to ground capacitance which exists in the circuits comprising the macro 14. The native capacitance for each macro 14 in the macro library 22 may be predefined for each macro 14, using well known methods, and/or may be determined as necessary, also using well known methods.

The native capacitance of a macro 14 is typically dependent upon many factors, including the design and layout of the devices and circuits forming the macro 14, and the semiconductor technology used to implement the macro 14. For example, in silicon devices formed on a bulk silicon substrate, the native capacitance may comprise n or p diffusion junction capacitance to the substrate or nwell, respectively, the capacitance of grounded sources, the static capacitance load arising from unused gates, etc. Many other sources of native capacitance may also be present.

Figure 4:
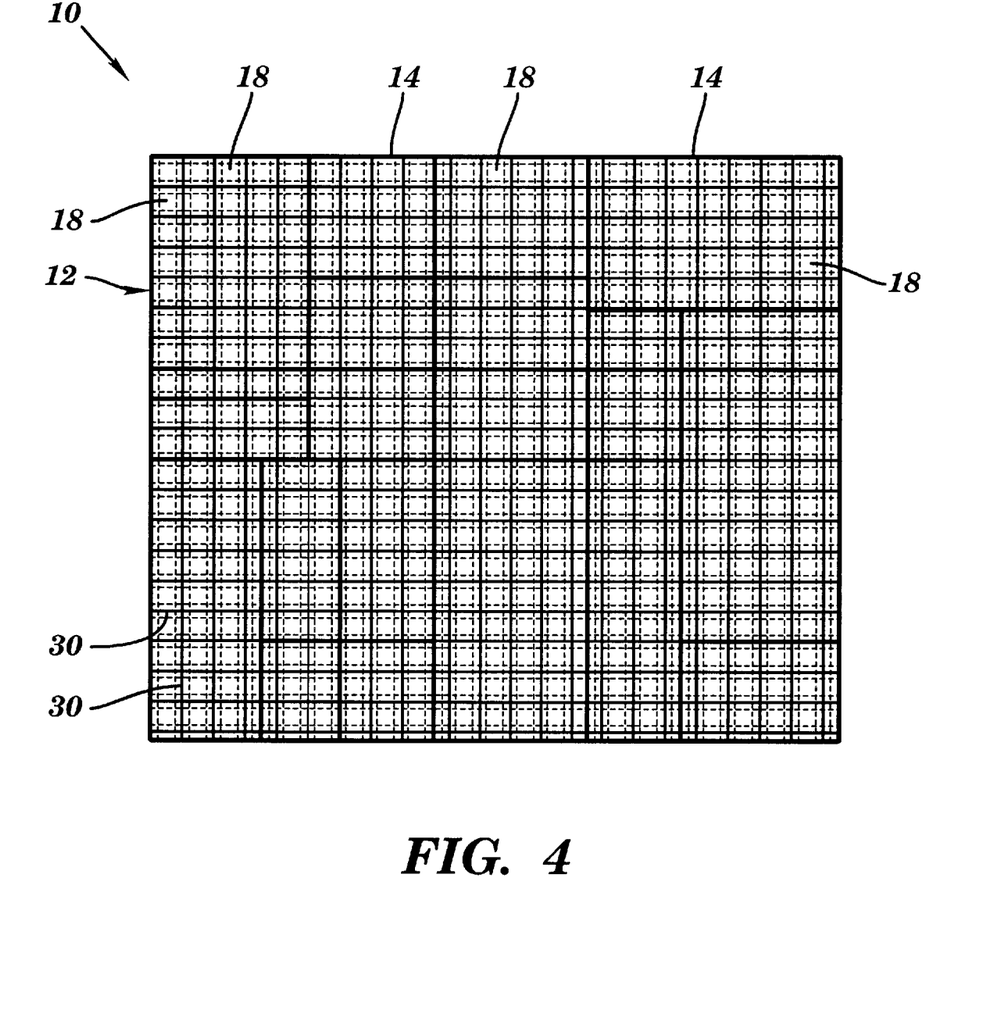
FIG. 4 illustrates the floor plan of FIG. 2 divided into a plurality of regions, in accordance with the present invention.

In step 32 of FIG. 3, and as illustrated in FIG. 4, the floor plan 12 of the integrated circuit chip 10 is divided into a grid having a plurality of regions 18. In the embodiment illustrated in FIG. 4, for example, the entire floor plan 12 is divided into a grid having a plurality of equal size regions 18. In an alternate embodiment of the present invention, the size of the regions 18 may vary for different macros 14, depending, for example, on topological power dissipation differences. In another alternate embodiment of the present invention, one or more macros 14 may not be divided into regions 18. This may occur, for example, if the macro 14 has a large relative size (e.g., the macro 14 comprises a SRAM) and the correct decoupling capacitance has already been built into the macro 14.

The size of the grid regions 18 is determined based on decoupling capacitor and supply impedance 34. In one embodiment of the present invention, it is assumed that the power VDD is being fed to the design represented by the floor plan 12 through pins on the boundary of the chip. If the power grid is uniform, the longest distance between a cell in the design and a power pin is at the center of the chip. The supply impedance comprises the resistance seen by the cell looking toward the VDD pin. The time to charge a capacitance (cell) at the center of the chip is a function of the size of the capacitance (cell intrinsic capacitance and load) and the resistance between VDD and the cell location. Likewise, if the decoupling capacitance is viewed as a temporary power supply, the previous relationship applies. Because the decoupling capacitor is closer to the cell, however, the resistance between the decoupling capacitor and the load capacitance is smaller. How much smaller is a function of the distance between them. The size of the grid regions 18, therefore, is a function of how far a decoupling capacitance can be away from the load capacitance and still be effective in preventing the power grid from dropping under a predetermined voltage. At a minimum, the size of the grid regions 18 is the size of the regions of the power grid. A less dense grid (i.e., a grid having larger grid regions 18), however, can be used in order to make the determination of required decoupling capacitance faster yet still accurate. One way to find the size of the grid is to peak one decoupling capacitance from the cell library (the largest for example for the most coarse grid) and determine how much load it can drive faster (preventing to much voltage drop) than the same load being driven by the power grid. If the load is translated into an average number of cells per region, the distance of the furthest cell from the decoupling capacitor can be determined. If the decoupling capacitor is placed at the center of a circle, for example, the diameter of the circle would be the diagonal of a grid region, and the grid pitch would be the largest square internal to the circle. For simplicity, the calculated grid region can be adjusted to be a multiple of the power grid. Repeating the same process for the smallest decoupling we get an upper bound on the grid size (the previous being the lower bound or less dense grid). In case the power VDD is being fed to the design not from the periphery but with a uniform distribution within the chip, the previous description still applies. However, the typical impedance from the power supply is smaller than before.

In step 36, after the size of the grid regions 18 has been established, the current requirements of the circuits located within each of the regions 18 are determined for various predetermined operational conditions (including, for example, activity factor based on average instruction stream, DC circuit topologies, as well as standby currents). Many circuit simulation tools exist for determining the current requirements within areas of an integrated circuit chip, including the program PowerMill® available from Synopsys. Generally, such tools calculate the AC and DC current draw or power requirements of discrete regions of an integrated circuit chip under simulated operational conditions.

In step 38, which may be performed in parallel with step 36, the native capacitance value within each region 18 is determined based on the native capacitance of the macro 14 in which the region 18 is located, as determined in step 30.

A support decoupling capacitance value required to support a voltage of the power grid 28 in each region 18 under predetermined current conditions (as determined in step 36) is provided in step 40. For example, the support decoupling capacitance value may be chosen to support the power grid voltage within a predetermined, application specific, range within each region 18 for all circuit elements operating at predetermined current levels (e.g., average or maximum operational current levels) within the region 18. The required decoupling capacitance value in each region 18 is then calculated by subtracting the native capacitance value determined for that region in step 38 from the support decoupling capacitance value for that region determined in step 40.

In step 42, the area required to implement the required decoupling capacitance value in each region 18 is determined, based on the applicable design rules 44 for the decoupling capacitors. Decoupling capacitors are then added to the design to provide the required decoupling capacitance value. The design rules 44 for the decoupling capacitors are typically dependent upon several factors, including gate oxide integrity, diffusion isolation defect control, minimum spacing between polysilicon anode plates, polysilicon and diffusion sheet resistance, poly/diffusion contact technology, etc.

Once the required decoupling capacitor area for each region 18 is determined in step 42, the process flow in FIG. 3 branches at step 46 depending upon the type of integrated circuit chip 10 that is being designed. The branching at step 46 is provided because of the differences (examples of which are described infra) in decoupling capacitor accounting built into the design methodology commonly employed for different chip types. For example, for ASICs (branch 48), a decoupling capacitance space requirement is typically built into each macro 18, while for microprocessors (branch 50), decoupling capacitance is typically added in empty regions of the macros 18, or even the whole integrated circuit chip 10. An additional branch 52 is provided for integrated circuit chips, such as digital signal processors (DSPs), analog communication chips, microcontrollers, etc., that may not fall under the above-described typical decoupling capacitance accounting practices of either ASICs or microprocessors. Branch 52 may comprise, for example, a modified version of the steps performed in branches 48 or 50, a combination of a set of the steps performed in branches 48 and 50, etc. It should also be noted that ASICs and microprocessors are not strictly limited to following the flow defined in branches 48 and 50, respectively. Indeed, depending on the specific design methodologies and decoupling capacitance accounting practices that are followed for particular ASIC and microprocessor designs, and well as other possible factors, flow for either type of integrated circuit chip may follow one or more of the branches 48 and 50 in the flowchart 20. Other chip types which may not necessarily fall under the categories of ASIC or microprocessor chips, may also follow one or both of the branches 48 and 50 in the flowchart 20.

In the ASIC branch 48, the area available for circuits in each region 18 is reduced in step 54 by the required decoupling capacitor area for that region 18. For example, if the design rules of a macro 14 (and/or of the integrated circuit chip 10) indicate that 40 circuits could be placed within a region 18, but the required decoupling capacitor area for that region 18 is equivalent to the area occupied by 10 circuits, a design placement rule exception for that region 18 is created (step 56) that limits the circuit placement to 30 circuits. Conversely, if an excessive amount of native capacitance is determined for a region 18 in step 38, resulting in a negative required decoupling capacitor area for that region 18 in step 40, then additional circuits could be placed in that region 18. Again, a design placement rule exception for that region 18 is created in step 56 to increase the circuit placement value for that region 18. This process is performed for each region 18 of the integrated circuit chip 10. Thereafter, in step 58, a new floor plan 12' is created based on the design placement rule exceptions generated in branch 48 of the flowchart 20.

In the microprocessor branch 50, the total required decoupling capacitor area for each macro 14 is determined in step 60 by summing up the required decoupling capacitor area calculated in step 42 for each region 18 comprising the macro 14. The total required decoupling capacitor area for each macro 14 is then compared in step 62 with the decoupling capacitor area available for that macro 14. If there is excess available decoupling capacitor area in a macro 14 (i.e., the available decoupling capacitor area minus the total required decoupling capacitor area yields a positive result), flow proceeds along branch 64 to step 66. In step 66, the space allocated to that macro 14 is reduced, for example, by altering the size, layout, and/or design of the macro 14. If it is determined in step 62 that there is not enough available decoupling capacitor area in a macro 14, flow proceeds along branch 68 to step 70, where additional decoupling capacitor space is added to that macro 14. This may be accomplished, for example, by providing additional space along the edges of the macro 14 for the placement of decoupling capacitors. These steps are performed for each macro 14 in the floor plan 12 of the integrated circuit chip 10, and the floor plan is modified in step 72 as necessary.

Figure 5:
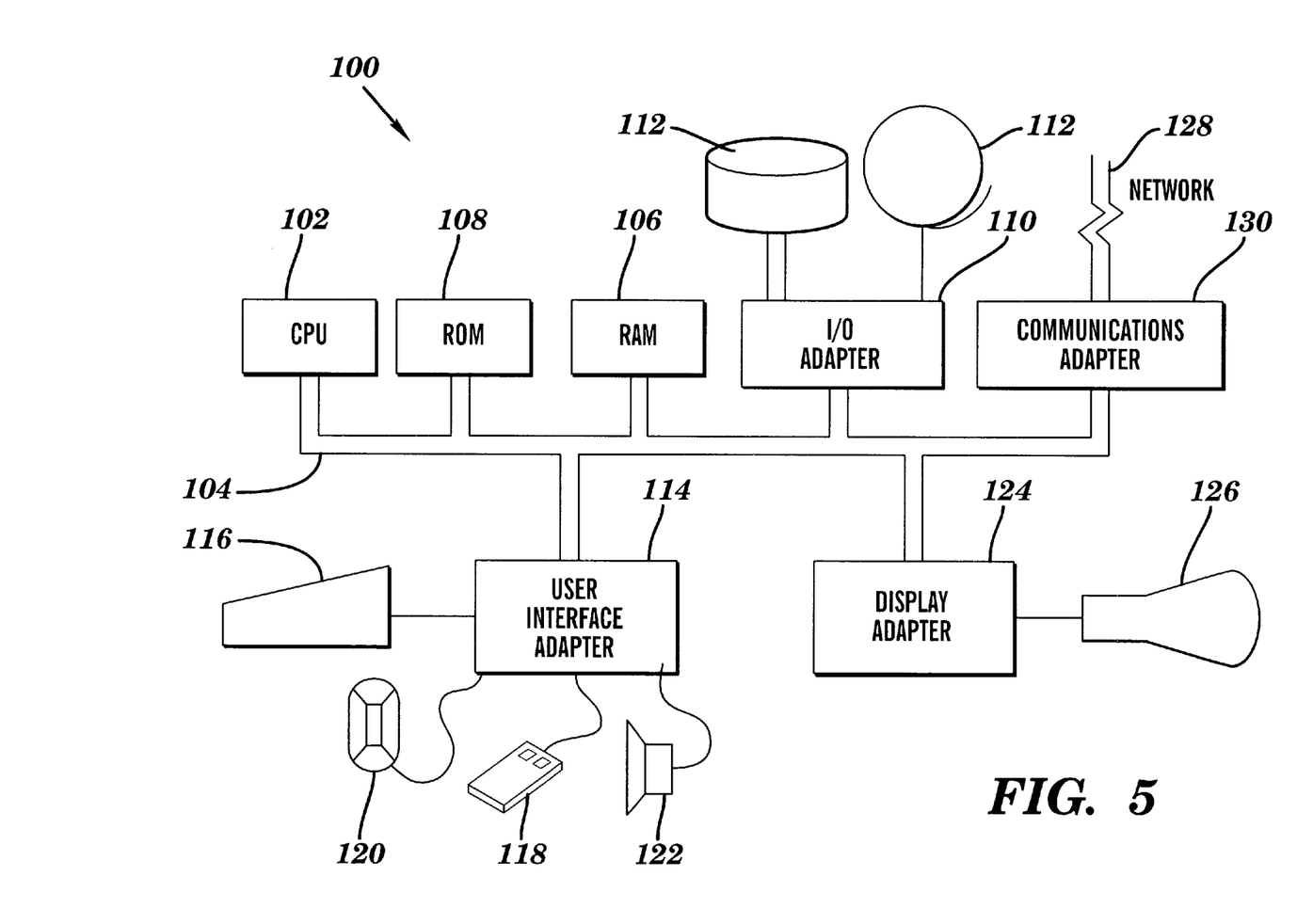
FIG. 5 illustrates a representative computer system for practicing the method of the present invention.

A representative computer system 100 for practicing the decoupling capacitor placement method of the present invention, is illustrated in FIG. 5. The computer system 100 comprises at least one processor 102 (e.g., a central processing unit (CPU)). The processor 102 is interconnected via bus 104 to a random access memory (RAM) 106, read only memory (ROM) 108, and input/output (I/O) adapter 110 for connecting various peripheral devices 112 to the bus 104. The peripheral devices 112 may include, inter alia, hard drives, compact disc (CD-ROM, CD-R, CD-RW) drives, tape drives, floppy disc drives, scanners, printers, video cameras, etc. A user interface adapter 114 is provided for connecting at least one user input device, such as a keyboard 116, mouse 118, microphone 120, speaker 122, etc., to the bus 104. A display adapter 124 is provided to interconnect at least one display device 126 to the bus 104. At least one data network 128 is connected to the bus 104 via one or more communication adapters 130. While FIG. 5 shows the computer system 100 as a particular configuration of hardware and software, any suitable configuration of hardware and software, as would be known to a person of ordinary skill in the art, may be utilized to perform the decoupling capacitor placement method of the present invention.

Another embodiment of the decoupling capacitor placement method of the present invention, such as the embodiment detailed in FIG. 3, can be implemented as one or more sets of instructions (e.g., computer readable program code). The instructions may be resident in the random access memory 106, or other suitable location, of one or more computer systems 100 configured generally as described with reference to FIG. 5. Until required by the computer system 100, the set of instructions may be stored in a removable or fixed computer usable medium, including, for example, a hard drive, floppy disk, magnetic tape, compact disc, optical disc, etc. The computer usable medium may be connected directly to the bus 104, or may be accessed through a suitable device, such as CD-ROM drive, floppy disk drive, etc. Further, the sets of instructions may be stored in the memory of another computer, or in a computer usable medium attached to another computer, and transmitted over a network, such as a local area network (LAN), wide area network (e.g., the Internet), etc. One skilled in the art would appreciate that the physical storage of the sets of instructions physically changes the medium upon which it is stored electrically, mechanically, or chemically, such that the medium carries computer usable information.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method for adding decoupling capacitance in an integrated circuit design, comprising:
    creating a floor plan for an integrated circuit, the floor plan comprising the relative locations of a plurality of functional units;
    overlaying a power grid on the floor plan;
    dividing the floor plan and the power grid into a plurality of regions; and, for each region:
        determining a support decoupling capacitance value required to support a voltage of the power grid;
        determining a native capacitance value;
        determining a required decoupling capacitance value based on the support decoupling capacitance value and the native capacitance value;
        determining a decoupling capacitor area for the required decoupling capacitance value; and
        modifying a circuit area in the region based on the decoupling capacitor area.

2. The method of claim 1, wherein the functional units include macros.

3. The method of claim 1, further comprising:
    selecting the plurality of functional units from a library; and
    creating the floor plan by placing the plurality of selected functional units in a logical relationship to each other.

4. The method of claim 1, wherein the integrated circuit comprises an application specific integrated circuit (ASIC).

5. The method of claim 1, wherein the integrated circuit comprises a microprocessor.

6. The method of claim 1, further comprising:
    modifying the floor plan based on the modified circuit area in each region.

7. The method of claim 1, further comprising:
    modifying a functional unit in the floor plan based on the modified circuit area in each region within the functional unit.

8. The method of claim 1, wherein the required decoupling capacitance value for each region is determined by subtracting the support decoupling capacitance value from the native capacitance value.

9. The method of claim 1, wherein each region has the same size.

10. The method of claim 1, wherein the regions within each functional unit have the same size.

11. The method of claim 1, further comprising:
    establishing a size of each region.

12. The method of claim 1, further comprising, for each region:
    reducing an available circuit area in the region by an amount corresponding to the decoupling capacitor area.

13. The method of claim 1, further comprising, for each region:
    increasing an available circuit area in the region by an amount corresponding to the decoupling capacitor area.

14. The method of claim 1, further comprising, for each functional unit:
    providing a predetermined amount of area available for decoupling capacitors;
    determining the total required decoupling capacitor area; and
    comparing the total required decoupling capacitor area to the available decoupling capacitor area.

15. The method of claim 14, further comprising:

determining the total required decoupling capacitor area for each functional unit by summing the required decoupling capacitor area for each region within the functional unit.

16. The method of claim 14, further comprising:

reducing space allocated to the functional unit in the floor plan if the total required decoupling capacitor area is less than the available decoupling capacitor area.

17. The method of claim 14, further comprising:

reducing a size of the functional unit if the total required decoupling capacitor area is less than the available decoupling capacitor area.

18. The method of claim 14, further comprising:

adjusting a layout of the functional unit if the total required decoupling capacitor area is less than the available decoupling capacitor area.

19. The method of claim 14, further comprising:

increasing the predetermined amount of area available for decoupling capacitance in the functional unit if the total required decoupling capacitor area is greater than the available decoupling capacitor area.

20. A method, comprising:

creating a floor plan for an integrated circuit;

dividing the floor plan into a plurality of regions; and, for each region:
    determining a support decoupling capacitance value required to support a voltage of a power grid of the floor plan;
    determining a native capacitance value;
    determining a required decoupling capacitance value based on the support decoupling capacitance value and the native capacitance value;
    determining a decoupling capacitor area for the required decoupling capacitance value; and
    modifying a circuit area in the region based on the decoupling capacitor area.

21. The method of claim 20, wherein the floor plan comprises a plurality of macros.

22. The method of claim 21, further comprising:

selecting the plurality of macros from a library; and creating the floor plan by placing the plurality of selected macros in a logical relationship to each other.

23. The method of claim 20, wherein the integrated circuit comprises an application specific integrated circuit (ASIC).

24. The method of claim 20, wherein the integrated circuit comprises a microprocessor.

25. The method of claim 20, further comprising:

modifying the floor plan based on the modified circuit area in each region.

26. The method of claim 21, further comprising:

modifying a macro in the floor plan based on the modified circuit area in each region within the macro.

27. The method of claim 20, wherein the required decoupling capacitance value for each region is determined by subtracting the support decoupling capacitance value from the native capacitance value.

28. The method of claim 20, wherein each region has the same size.

29. The method of claim 21, wherein the regions within each macro have the same size.

30. The method of claim 20, further comprising:

establishing a size of each region.

31. The method of claim 20, further comprising, for each region:

reducing an available circuit area in the region by an amount corresponding to the decoupling capacitor area.

32. The method of claim 20, further comprising, for each region:

increasing an available circuit area in the region by an amount corresponding to the decoupling capacitor area.

33. The method of claim 21, further comprising, for each macro:

providing a predetermined amount of area available for decoupling capacitors;

determining the total required decoupling capacitor area; and comparing the total required decoupling capacitor area to the available decoupling capacitor area.

34. The method of claim 33, further comprising:

determining the total required decoupling capacitor area for each macro by summing the required decoupling capacitor area for each region within the macro.

35. The method of claim 33, further comprising:

reducing space allocated to the macro in the floor plan if the total required decoupling capacitor area is less than the available decoupling capacitor area.

36. The method of claim 33, further comprising:

reducing a size of the macro if the total required decoupling capacitor area is less than the available decoupling capacitor area.

37. The method of claim 33, further comprising:

adjusting a layout of the macro if the total required decoupling capacitor area is less than the available decoupling capacitor area.

38. The method of claim 33, further comprising:

increasing the predetermined amount of area available for decoupling capacitance in the macro if the total required decoupling capacitor area is greater than the available decoupling capacitor area.

39. A computer program product, comprising:

a computer usable medium having a computer readable program code embodied therein for performing a method for adding decoupling capacitance in an integrated circuit design, the computer readable program code including:
    code for causing a computer system to create a floor plan for an integrated circuit;
    code for causing a computer system to divide the floor plan into a plurality of regions; and, for each region:
    code for causing a computer system to determine a support decoupling capacitance value required to support a voltage of a power grid of the floor plan;
    code for causing the computer system to determine a native capacitance value;
    code for causing the computer system to determine a required decoupling capacitance value based on the support decoupling capacitance value and the native capacitance value;
    code for causing the computer system to determine a decoupling capacitor area for the required decoupling capacitance value; and
    code for causing the computer system to modify a circuit area in the region based on the decoupling capacitor area.

40. The computer program product of claim 39, wherein the floor plan comprises a plurality of macros, further comprising:

code for causing the computer system to select the plurality of macros from a library; and code for causing the computer system to create the floor plan by placing the plurality of selected macros in a logical relationship to each other.

41. The computer program product of claim 39, further comprising:

code for causing the computer system to modify the floor plan based on the modified circuit area in each region.

42. The computer program product of claim 39, wherein the floor plan comprises a plurality of macros, further comprising:

code for causing the computer system to modify a macro in the floor plan based on the modified circuit area in each region within the macro.

43. The computer program product of claim 39, wherein the code for causing the computer system to determine a required decoupling capacitance value includes code for causing the computer system to subtract the support decoupling capacitance value from the native capacitance value.

44. The computer program product of claim 39, further comprising:

code for causing the computer system to establish a size of each region.

45. The computer program product of claim 39, further comprising:

code for causing the computer system to reduce available circuit area in each region by an amount corresponding to the decoupling capacitor area.

46. The computer program product of claim 39, further comprising:

code for causing the computer system to increase an available circuit area in each region by an amount corresponding to the decoupling capacitor area.

47. The computer program product of claim 42, further comprising, for each macro:

code for causing the computer system to provide a predetermined amount of area available for decoupling capacitors;

code for causing the computer system to determine the total required decoupling capacitor area; and code for causing the computer system to compare the total required decoupling capacitor area to the available decoupling capacitor area.

48. The computer program product of claim 47, further comprising:

code for causing the computer system to determine the total required decoupling capacitor area for each macro by summing the required decoupling capacitor area for each region within the macro.

49. The computer program product of claim 47, further comprising:

code for causing the computer system to reduce space allocated to the macro in the floor plan if the total required decoupling capacitor area is less than the available decoupling capacitor area.

50. The computer program product of claim 47, further comprising:

code for causing the computer system to reduce a size of the macro if the total required decoupling capacitor area is less than the available decoupling capacitor area.

51. The computer program product of claim 47, further comprising:

code for causing the computer system to adjust a layout of the macro if the total required decoupling capacitor area is less than the available decoupling capacitor area.

52. The computer program product of claim 47, further comprising:

code for causing the computer system to increase the predetermined amount of area available for decoupling capacitance in the macro if the total required decoupling capacitor area is greater than the available decoupling capacitor area.

* * * * *